(12) United States Patent
Ohtsuki et al.

(10) Patent No.: US 6,818,987 B2
(45) Date of Patent: Nov. 16, 2004

(54) ELECTRONIC COMPONENT AND PROCESS FOR MANUFACTURING THE SAME

(75) Inventors: Tomonari Ohtsuki, Tokyo (JP); Yasue Yamazaki, Tokyo (JP)

(73) Assignee: DDK Ltd., Tokyo (JP)

( * ) Notice: Subject to any disclaimer, the term of this patent is extended or adjusted under 35 U.S.C. 154(b) by 152 days.

(21) Appl. No.: 10/132,557

(22) Filed: Apr. 25, 2002

(65) Prior Publication Data

US 2002/0163084 A1 Nov. 7, 2002

(30) Foreign Application Priority Data

May 7, 2001 (JP) ......................................... 2001-135839

(51) Int. Cl.[7] ......................... H01L 23/48; H01L 23/52; H01L 29/40
(52) U.S. Cl. ....................... 257/737; 257/738; 257/772; 257/762
(58) Field of Search ............................... 257/737, 738, 257/772, 762

(56) References Cited

U.S. PATENT DOCUMENTS

| | | | | |
|---|---|---|---|---|
| 4,651,191 A | * | 3/1987 | Ooue et al. ................. 257/772 |
| 5,368,814 A | * | 11/1994 | Gonya et al. ................ 420/587 |
| 5,470,787 A | * | 11/1995 | Greer .......................... 438/614 |
| 5,938,862 A | * | 8/1999 | Yeh et al. .................... 148/400 |
| 6,086,687 A | * | 7/2000 | Oud et al. ................... 148/400 |
| 6,208,156 B1 | * | 3/2001 | Hembree ..................... 324/755 |
| 6,241,145 B1 | * | 6/2001 | Maeda et al. .......... 228/180.22 |
| 6,286,206 B1 | * | 9/2001 | Li ................................ 29/840 |
| 6,468,413 B1 | * | 10/2002 | Fanti et al. ................. 205/682 |
| 6,493,238 B1 | * | 12/2002 | Pai ............................. 361/772 |
| 2001/0001990 A1 | * | 5/2001 | Kitajima et al. ............ 174/260 |
| 2001/0018800 A1 | * | 9/2001 | Tzanavaras et al. .......... 29/847 |
| 2002/0036227 A1 | * | 3/2002 | Milewski et al. ........... 228/246 |
| 2003/0030149 A1 | * | 2/2003 | Miura et al. ................ 257/772 |

* cited by examiner

Primary Examiner—Amir Zarabian
Assistant Examiner—Ida M. Soward
(74) Attorney, Agent, or Firm—Baker Botts L.L.P.

(57) ABSTRACT

In an electronic component provided with an electric contact (s) producing an electric conduction by contacting with a contact(s) of a second electronic component, the electric contact comprises a lead-free alloy layer containing tin and silver, and a surface layer portion of the alloy layer at least contacting with the contact of the second electronic component is a tin-rich layer having a tin content higher than that of the other portion of the alloy layer.

6 Claims, 5 Drawing Sheets

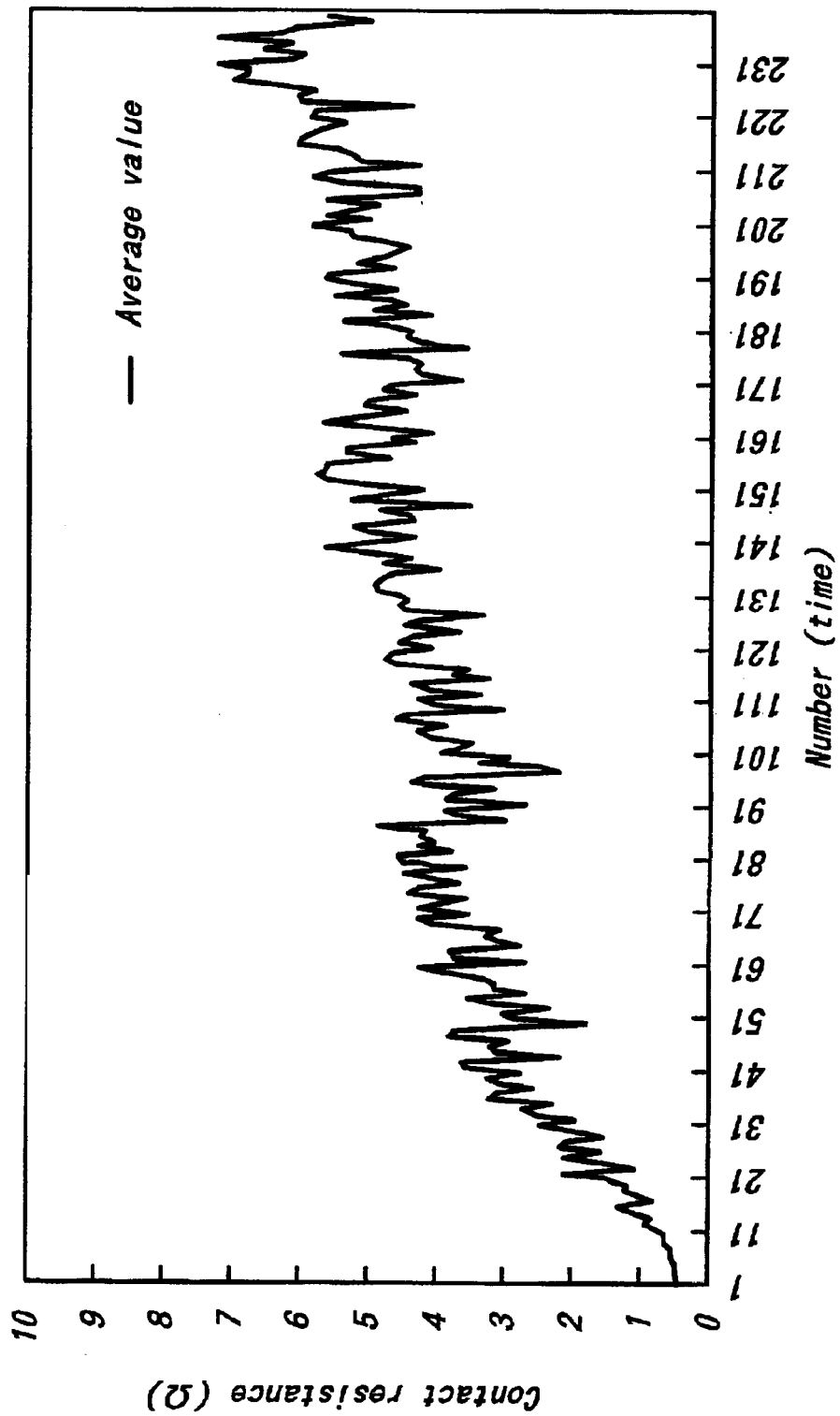

ELECTRONIC COMPONENT AND PROCESS FOR MANUFACTURING THE SAME

BACKGROUND OF THE INVENTION

1. Field of the Invention

This invention relates to an (a first) electronic component such as a BGA (Ball Grid Array) chip or the like and a process for manufacturing the same, and more particularly to an (a first) electronic component wherein an electric contact as a contact terminal of the (first) electronic component is formed by subjecting to a surface treatment with an alloy containing tin and silver without the inclusion of lead causing an environmental problem and reduces a contact resistance as compared with an electric contact of an electronic component formed by a conventional surface treatment with an alloy containing tin and lead.

2. Description of Related Art

A conventional electronic component, for example, a BGA chip provided on its undersurface with electric contacts as a grid pattern, each of which being made of a solder in a substantially semispherical shape, is detachably mounted onto a socket connector, whereby the electric contact(s) of the BGA chip is contacted with the respective contact(s) formed on a conductor of a substrate constituting the socket connector to attain an electric conduction.

The conventional BGA chip is constituted with a soft resin substrate or the like connected with a rigid ceramic through a rewiring layer, and an eutectic solder having a composition of 62 mass % Sn-38 mass % Pb or a solder having a composition of 85 mass % Sn-15 mass % Pb is placed on plural lands formed on a one-side surface of the soft resin substrate and subjected to a reflow treatment to form electric contacts. In general, each of the electric contacts is contacted with each of plural contacts formed on the conductors of the substrate constituting the socket connector so as to attain the electric conduction.

However, the lead is a harmful heavy metal to human body. If a product containing the lead becomes useless and is disposed to an outdoor, Pb is eluted from the product into an aqueous solution such as acid rain or the like. Such an eluted lead tends to cause serious problems such as pollution of global environment, bad influence on a living thing and so on, so that it is unfavorable from the problem on the environment to use the electric contact subjected to a surface treatment with a Sn—Pb based alloy containing lead (for example, Sn—Pb solder).

And also, in view of the application of the electronic component, the BGA chip is required to be able to repeatedly attach to and detach from the socket connector, so that when the electric contact of the BGA chip is contacted with the contact of the socket connector by attaching the BGA chip to the socket connector, it is desirable to always obtain a stable value of contact resistance. However, when the BGA chip provided with the electric contacts formed by subjecting to the tin-lead surface treatment is repeatedly attached to and detached from the socket connector, the value of the contact resistance largely changes every attachment or detachment of the BGA and hence the stable value of the contact resistance can not be obtained.

To this end, it is demanded to develop electric contacts stably providing a contact resistance value and formed by subjecting to a surface treatment with a new composition system in place of the tin-lead solder containing lead.

SUMMARY OF THE INVENTION

It is, therefore, an object of the invention to provide an electronic component such as a BGA chip which is provided with electric contacts formed by subjecting to a surface treatment with an alloy containing tin and silver and containing no lead, which causes a problem on the environment, and stabilizes a contact resistance of the electric contact as compared with that of an electric contact of an electronic component formed by subjecting to the conventional surface treatment with the tin-lead alloy as well as a process for manufacturing the same.

According to a first aspect of the invention, there is the provision of an (a first) electronic component provided with an electric contact(s) producing an electric conduction by contacting with a contact of a second electronic component, said electric contact comprising a lead-free alloy layer containing tin and silver, a surface layer portion of said alloy layer at least contacted with the contact of the second electronic component being a tin-rich layer having a tin content higher than that of the other portion of the alloy layer.

In a preferable embodiment of the first aspect of the invention, the contact is formed on a conductor of a substrate constituting the second electronic component and the electric contact is formed on a conductor of a substrate constituting the first electronic component.

In another preferable embodiment of the first aspect of the invention, the first electronic component is a ball grid array (BGA) chip and the electric contact is formed on a conductor arranged at one side of a substrate constituting the BGA chip in a substantially semispherical shape by using an alloy solder containing tin and silver.

In the other preferable embodiment of the first aspect of the invention, a top of the electric contact in the BGA chip contacts with the contact of the second electronic component.

In a further preferable embodiment of the first aspect of the invention, the second electron component is a socket connector and the BGA chip is detachably mounted onto the socket connector to contact the contact of the socket connector with the electric contact of the BGA chip.

In a still further preferable embodiment of the first aspect of the invention, the alloy layer is a tin-silver-copper alloy layer containing no less than 90% of tin.

According to a second aspect of the invention, there is the provision of in a process for manufacturing an (a first) electronic component provided with an electric contact(s) producing electrical conduction by contacting with a contact (s) formed on a conductor of a substrate constituting a second electronic component, an improvement wherein a lead-free alloy layer containing tin and silver is formed on a conductor of a substrate constituting the first electronic component and subjected to a reflow treatment and then cooled at a relatively slow cooling rate to form the electric contact.

In a preferable embodiment of the second aspect of the invention, a surface layer portion of the alloy layer at least contacted with the contact of the second electronic component is provided with a tin-rich layer having a tin content higher than that of the other portion of the alloy layer.

In another preferable embodiment of the second aspect of the invention, the cooling after the reflow treatment is carried out at a cooling rate of no more than 50° C./min.

In the other preferable embodiment of the second aspect of the invention, the first electronic component is a ball grid array (BGA) chip and the electric contact is formed on a conductor arranged at one side of a substrate constituting the BGA chip in a substantially semispherical shape by using an alloy solder containing tin and silver.

In a further preferable embodiment of the second aspect of the invention, the alloy layer is a tin-silver-copper alloy layer containing no less than 90% of tin.

In a still further preferable embodiment of the second aspect of the invention, the second electron component is a socket connector and the BGA chip is detachably mounted onto the socket connector to contact the contact of the socket connector with a top of the electric contact of the BGA chip.

According to the invention, as the electric contact of the (first) electronic component is formed by subjecting to the surface treatment with the alloy containing tin and silver without lead causing an environmental problem, there is not caused the environmental problem resulted from the outflow of the lead.

And also, the contact resistance in the electric contact of the (first) electronic component according to the invention can be largely reduced as compared with that of the electric contact in the conventional electronic component formed by subjecting to the surface treatment with the tin-lead alloy.

In the (first) electronic component according to the invention, even when the electric contact is repeatedly contacted with a contact of the second electronic component, the scattering of the contact resistance is small, and it is possible to always attain electric conduction at a low contact resistance.

BRIEF DESCRIPTION OF THE DRAWINGS

The patent application file contains at least one drawing executed in color. Copies of this patent application publication with color drawings will be provided by the Office upon request and payment of the necessary fee.

The invention will be described with reference to the accompanying drawings, wherein:

FIG. 7 is a graph showing experimental results when measuring a contact resistance by using the conventional BGA chip of FIG. 4.

DETAILED DESCRIPTION OF THE INVENTION

Figure 1:
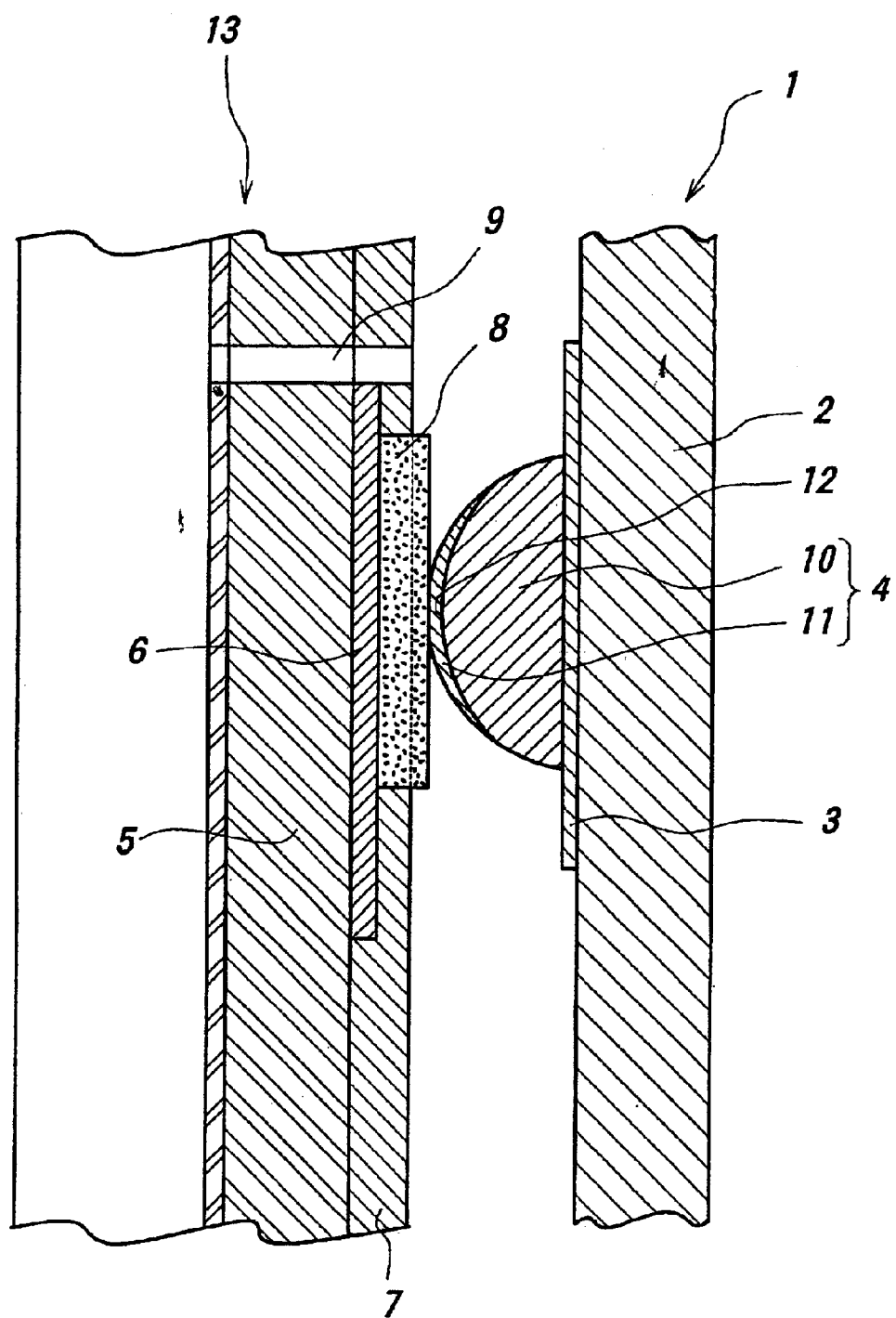
FIG. 1 is a diagrammatically section view of a main portion of a BGA chip as a representative embodiment of the (first) electronic component according to the invention illustrating a state of mounting onto a socket connector.

In FIG. 1 is shown a diagrammatically section view of a main portion of a BGA chip 1 as a representative embodiment of the first electronic component according to the invention showing a state of mounting (or fitting) onto a socket connector 13.

In the BGA chip 1 of FIG. 1, an electric contact(s) 4 is formed on a conductor(s) 3 of a soft resin substrate 2 connected with a rigid ceramic through a rewiring layer as well as the conventional one. Since the electric contact 4 is a portion contacting with a contact 8 of the socket connector 13, it is desirable that a contact resistance is small when the electric contact 4 is electrically contacted with the contact 8. The electric contact 4 can be formed in a desired shape such as a projection, a flat surface or the like by various methods such as a solder ball, a plating and the like. In general, the required wiring such as a printed wiring connected to the electric contact 4 is formed on the substrate 2 of the first electronic component. Moreover, in FIG. 1 is shown a case that the electric contact 4 is formed as a bump of a substantially semispherical shape projected from the conductor.

And also, the socket connector 13 shown FIG. 1 comprises a substrate 5 made of a soft resin material or the like, a conductor 6 of a disc-shaped metal layer formed on one side of the substrate 5, a protective covering layer 7 of an insulating material or the like formed at the side forming the conductor of the substrate 5, a contact 8 formed on the conductor 6. As shown in FIG. 1, a slit-like cut 9 is formed in the substrate 5 around the conductor 6 so as to make such a structure that the portion of the conductor 6 has a flexibility, whereby the scattering of the height in the electric contact 4 of the BGA chip 1 can be absorbed.

The invention lies in a point that the electric contact 4 is comprised of a lead-free alloy layer 10 containing tin and silver, and a surface layer portion of the alloy layer 10 at least contacted with the contact 8 is formed with a tin-rich layer 11 having a tin content higher than that of the other portion of the alloy layer 10. By adopting such a structure can be obtained a stable contact when the electric contact 4 is contacted with the contact 8 arranged on the patterned conductor 6 of the substrate 5 in the second electronic component such as the socket connector 13, and also the contact resistance can be reduced. Furthermore, a low contact resistance can be stably obtained even when the BGA chip 1 as the first electronic component is repeatedly mounted onto the socket connector 13.

Moreover, although the reason why the contact resistance becomes smaller is not clear, it has been confirmed from various experimental results that the contact resistance becomes smaller when a tin crystal precipitates on a surface layer of the electric contact.

Further, the alloy layer 10 containing tin is preferable to be a tin-silver-copper alloy layer. In this case, a composition ratio of the tin-silver-copper alloy layer is more preferable to be a composition that silver is a range of 3.0–3.5 mass %, copper is a range of 0.50–0.75 mass % and the remainder is tin.

Next, a process for manufacturing the first electronic component according to the invention will be described below. At first, an alloy layer 10 containing tin and silver, for example, tin-silver-copper alloy layer is formed on a conductor 3 located at one side of a first electronic component, for example, a BGA chip 1.

In case of forming the alloy layer 10 as a bump of a substantially semispherical shape, it is preferable to use an alloy solder containing tin and silver. And also, the other forming process such as a plating or the like may be used.

After the alloy layer 10 is formed on the conductor 3, it is subjected to a reflow treatment.

By cooling after the reflow treatment, a surface layer portion of the alloy layer 10 at least contacted with the contact 8 is formed with a tin-rich layer 11 having a tin content higher than that of the other portion of the alloy layer 10. Moreover, the term "tin-rich layer" used herein means a layer having a tin content higher than an average value of the tin content in the alloy layer, in particular, a layer having a silver content lower than that of the other portion of the alloy layer 10.

Furthermore, as a cooling condition after the reflow treatment, in case of, for example, the tin-silver-copper alloy layer, a cooling rate is preferable to be no more than 50° C./min considering a point of utilizing the segregation of the constituting element produced during the change from the liquid to the solid.

Moreover, in case of cooling the electric contact 4 formed in the substantially semispherical shape, considering that it is most difficult to cool at a top 12 of the electric contact 4 in which the thickness of the electric contact 4 becomes thickest and the cooling rate at the top 12 becomes latest, if the cooling is carried out within the above preferable range of the cooling rate, a granular tin crystal can be precipitated on at least a surface layer of the top 12 in the electric contact 4 and hence the contact resistance can be reduced.

Further, the above preferable range of the cooling condition is mainly shown on the assumption that the top 12 of the electric contact 4 is contacted with the contact 8. For example, if a portion of the electric contact 4 other than the top 12 is contacted with the contact 8, the cooling rate may be set to such a level that the tin crystal precipitates on the portion contacting with the contact 8.

Figure 2A:
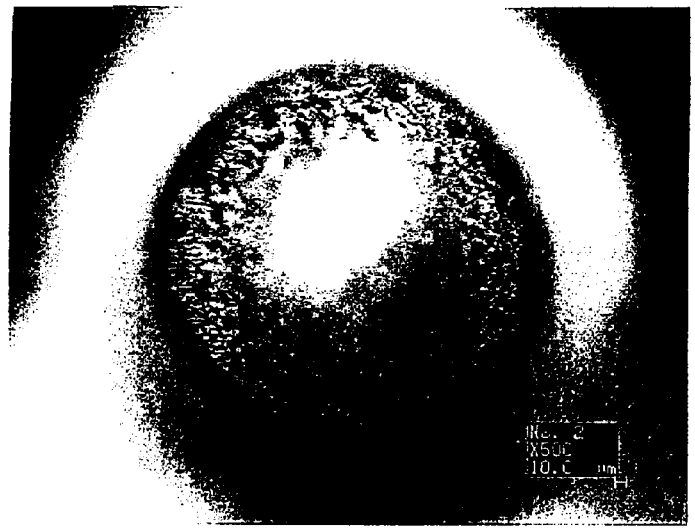
FIG. 2A is a photograph being an elevation view of an appearance of an electric contact in the BGA chip according to the invention.
Figure 2B:
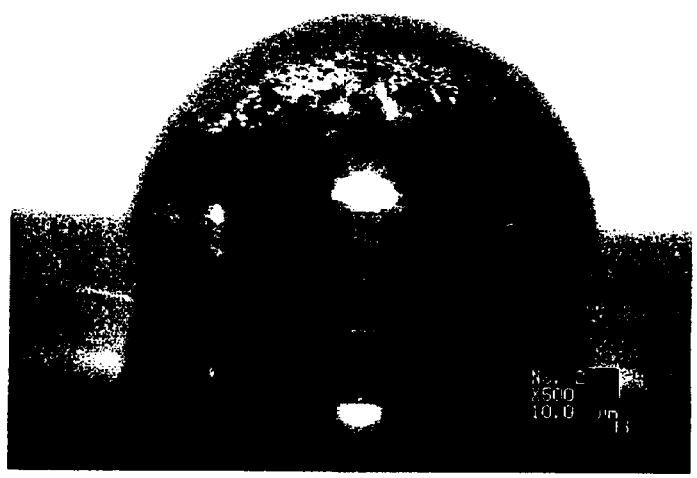
FIG. 2B is a photograph being a side view of an appearance of an electric contact in the BGA chip according to the invention.
Figure 3:
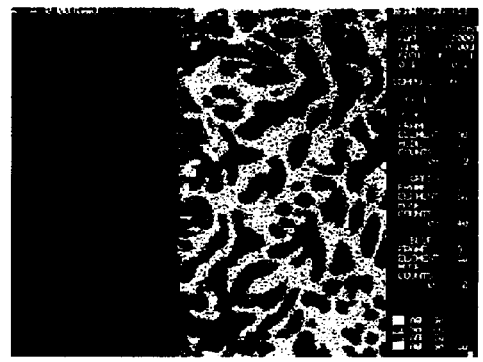
FIG. 3 is a map showing results of an elemental analysis on the electric contact shown in FIG. 2 in a sectional direction through EPMA.

FIGS. 2A and 2B are elevation and side views of an appearance in an electric contact 4 of a BGA chip 1, for example, when a solder of 96.5 mass % Sn-3.0 mass % Ag-0.5 mass % Cu is formed in a substantially semispherical shape and gradually cooled by leaving to stand in an atmosphere after a reflow treatment according to the above production condition, respectively. FIG. 3 shows results of an elemental analysis (a mapping analysis) on the thus formed electric contact 4 in a sectional direction from a surface layer portion thereof (a direction going downward from the top of the electric contact in FIG. 2A) through EPMA (Electron Probe Microanalysis).

Figure 4A:
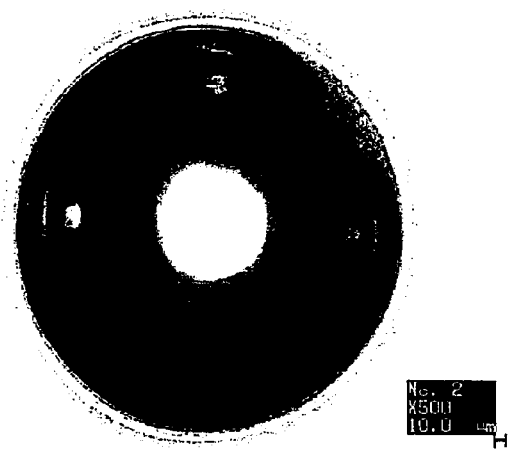
FIG. 4A is a photograph being an elevation view of an appearance of an electric contact in the conventional BGA chip.
Figure 4B:
FIG. 4B is a photograph being a side view of an appearance of an electric contact in the conventional BGA chip.
Figure 5:
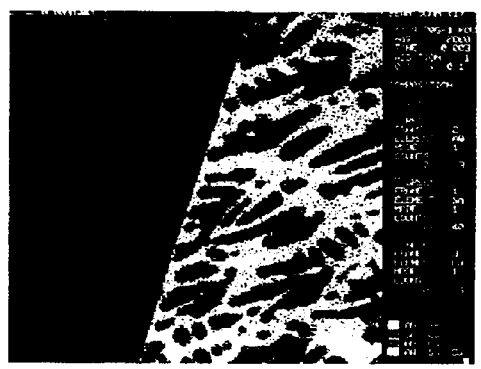
FIG. 5 is a map showing results of an elemental analysis on the electric contact shown in FIG. 4 in a sectional direction through EPMA.

For the comparison, FIGS. 4A and 4B are elevation and side views of an appearance in an electric contact of the conventional BGA chip, for example, when a solder of 62 mass % Sn-38 mass % Pb is formed as a bump and gradually cooled by leaving to stand in an atmosphere after a reflow treatment, respectively. FIG. 5 shows results of an elemental analysis (a mapping analysis) on the conventional electric contact in a sectional direction from a surface layer portion thereof (a direction going downward from the top of the electric contact in FIG. 4A) through the EPMA.

In the (first) electronic component according to the invention, as seen from FIG. 2, the surface layer portion of the electric contact, more strictly, a surface layer portion located at the top of the electric contact has a rough surface, which is a tin-rich layer as seen from the analysis result of FIG. 3. On the other hand, as seen from FIG. 4, the whole surface layer of the electric contact in the conventional electronic component has a glossy and smooth surface. As seen from the analysis result of FIG. 5, there is not observed a difference in an existence ratio of tin and lead between the surface of the electric contact and the other portion thereof.

Next, the contact resistance is measured with respect to the first electronic component of FIG. 2 according to the invention and the conventional electronic component of FIG. 4.

Figure 6:
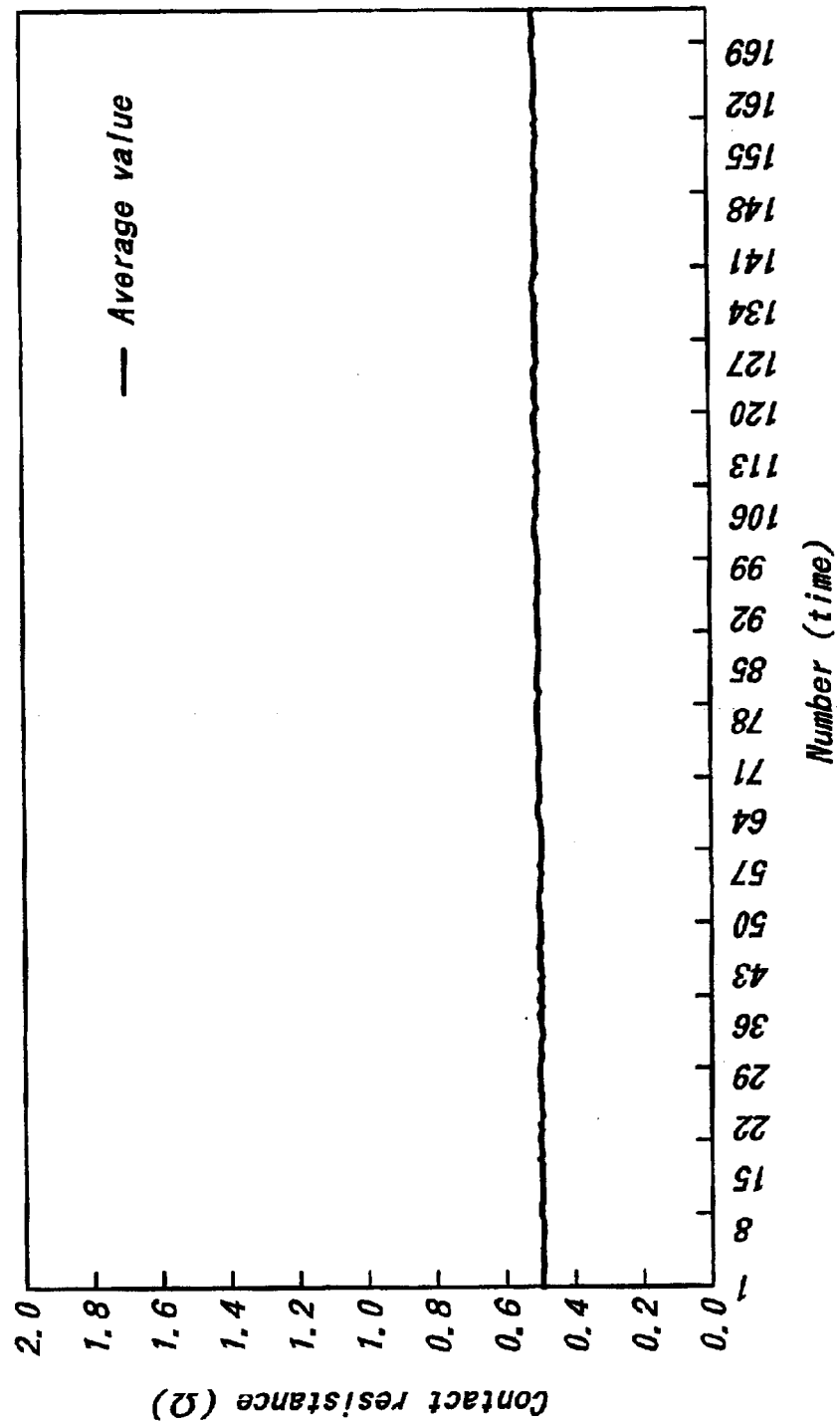
FIG. 6 is a graph showing experimental results when measuring a contact resistance by using the BGA chip of FIG. 2 according to the invention.

FIG. 6 shows results measured on the contact resistance of the (first) electronic component according to the invention, and FIG. 7 shows results measured on the contact resistance of the conventional electronic component.

As seen from the results of FIGS. 6 and 7, there is not a great scattering of the contact resistance value in the first electronic component of the invention even if the electric contact is repeatedly contacted with the contact of the second electronic component and the contact resistance value is low (0.45–0.60Ω). On contrary, in the conventional electronic component, the scattering of the contact resistance value is large, and also the contact resistance value becomes larger by one order or more than that of the invention.

Although the above is described with respect to only a preferred embodiment of the invention, various modifications may be taken within a scope of the invention.

What is claimed is:

1. An electronic component provided with an electric contact(s) producing an electric conduction by contacting with a contact(s) of a second electronic component, said electric contact comprising a lead-free alloy layer containing tin and silver, a surface layer portion of said alloy layer at least contacted with the contact of the second electronic component being an tin-rich layer having a tin content higher than that of the other portion of the alloy layer.

2. An electronic component according to claim 1, wherein the contact is formed on a conductor of a substrate constituting the second electronic component and the electric contact is formed on a conductor of a substrate constituting the first electronic component.

3. An electronic component according to claim 2, wherein the first electronic component is a ball grid array (BGA) chip and the electric contact is formed on a conductor arranged at one side of a substrate constituting the BGA chip in a substantially semispherical shape by using an alloy solder containing tin and silver.

4. An electronic component according to claim 3, wherein a top of the electric contact in the BGA chip contacts with the contact of the second electronic component.

5. An electronic component according to claim 3, wherein the second electronic component is a socket connector and the BGA chip is detachably mounted onto the socket connector to contact the contact thereof with the electric contact of the BGA chip.

6. An electronic component according to claim 1, wherein the alloy layer is a tin-silver-copper alloy layer containing no less than 90% of tin.

* * * * *